United States Patent
Hajibabaeinajafabadi et al.

(10) Patent No.: US 12,287,578 B2
(45) Date of Patent: *Apr. 29, 2025

(54) CYCLIC METHOD FOR REACTIVE DEVELOPMENT OF PHOTORESISTS

(71) Applicant: Tokyo Electron Limited, Tokyo (JP)

(72) Inventors: Hamed Hajibabaeinajafabadi, Albany, NY (US); Akiteru Ko, Albany, NY (US); Yu-Hao Tsai, Albany, NY (US); Sergey Voronin, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 305 days.

This patent is subject to a terminal disclaimer.

(21) Appl. No.: 17/888,135

(22) Filed: Aug. 15, 2022

(65) Prior Publication Data
US 2024/0053684 A1 Feb. 15, 2024

(51) Int. Cl.
*G03F 7/36* (2006.01)
*H01L 21/308* (2006.01)

(52) U.S. Cl.
CPC ............ *G03F 7/36* (2013.01); *H01L 21/3086* (2013.01)

(58) Field of Classification Search
CPC .................. H01L 21/3086; H01L 21/0274
See application file for complete search history.

(56) References Cited

U.S. PATENT DOCUMENTS

| | | | |
|---|---|---|---|
| 2012/0073568 A1* | 3/2012 | Kapelanczyk | C23C 8/18 148/276 |
| 2014/0263172 A1* | 9/2014 | Xie | H01L 21/68707 216/41 |
| 2022/0004105 A1* | 1/2022 | Dai | G03F 7/0047 |
| 2022/0020584 A1* | 1/2022 | Volosskiy | H01L 21/0274 |
| 2022/0199406 A1* | 6/2022 | Kalutarage | G03F 7/0042 |
| 2024/0045337 A1* | 2/2024 | Hajibabaeinajafabadi | H01L 21/3065 |

FOREIGN PATENT DOCUMENTS

| WO | 2004095551 A1 | 11/2004 |
| WO | 2020264158 A1 | 12/2020 |
| WO | 2021158433 A1 | 8/2021 |

OTHER PUBLICATIONS

International Search Report and Written Opinion, International Application No. PCT/US2023/028661, dated Nov. 10, 2023, 10 pages.

* cited by examiner

*Primary Examiner* — Binh X Tran
(74) *Attorney, Agent, or Firm* — Slater Matsil, LLP

(57) ABSTRACT

A method of processing a substrate includes receiving a substrate including a photoresist film including exposed and unexposed portions, etching parts of the unexposed portions of the photoresist film with a developing gas in a process chamber to leave a residual part of the unexposed portions, and purging the developing gas from the process chamber with a purging gas. After purging the developing gas, the residual part of the unexposed portions is etched with the developing gas. The substrate is etched using exposed portions of the photoresist film as a mask.

20 Claims, 6 Drawing Sheets

CYCLIC METHOD FOR REACTIVE DEVELOPMENT OF PHOTORESISTS

TECHNICAL FIELD

The present invention relates generally to the field of semiconductor manufacturing and semiconductor devices, and, in particular embodiments, to methods of developing metal oxide resists for Extreme Ultraviolet (EUV) patterning.

BACKGROUND

Photolithography is commonly used to pattern thin films during semiconductor processing, where photons are emitted from a light source onto a photosensitive photoresist to initiate a chemical reaction in the photoresist. Thereafter, the photoresist is developed and exposed or unexposed portions of the photoresist are removed to form a pattern or a mask.

Scaling of semiconductor devices has enabled significant technological advances, including advanced lithographic techniques such as immersion lithography. Extreme Ultraviolet (EUV) radiation can be used for providing improved pattern resolution in advanced integrated circuits where reduction in feature sizes is required. Common EUV photoresists are polymer-based chemically amplified resists (CARs) that are deposited on substrates using liquid-based spin-on techniques that consume a significant amount of complex precursors. Recently, inorganic-based resists have received interest as they may be patterned using EUV radiation and can offer the high etch resistance and etch selectivity needed for semiconductor manufacturing. However, processing and development of inorganic-based resists presents new challenges.

SUMMARY

In accordance with an embodiment, a method of processing a substrate includes: receiving a substrate including a photoresist film including exposed and unexposed portions; etching parts of the unexposed portions of the photoresist film with a developing gas in a process chamber to leave a residual part of the unexposed portions; purging the developing gas from the process chamber with a purging gas; after purging the developing gas, etching the residual part of the unexposed portions with the developing gas; and etching the substrate using exposed portions of the photoresist film as a mask.

In accordance with another embodiment, a method of patterning a photoresist film includes: exposing a photoresist film to a pattern of extreme ultraviolet light, the photoresist film being over a substrate; and performing a cyclic development process on the photoresist film in a process chamber, where a first cycle of the cyclic development process includes: flowing a developing gas in the process chamber to etch unexposed portions of the photoresist film, and purging the developing gas from the process chamber by flowing a purging gas.

In accordance with yet another embodiment, a method of processing a substrate includes: forming a photoresist film over a substrate; exposing the photoresist film to a pattern of extreme ultraviolet light; flowing a developing gas at a first pressure to etch unexposed portions of the photoresist film; performing a first purge of the developing gas by flowing a purging gas; flowing the developing gas at a second pressure to further etch the unexposed portions of the photoresist film; and performing a second purge of the developing gas by flowing the purging gas.

It is to be understood that both the foregoing general description and the following detailed description are exemplary and explanatory only and are not restrictive of the disclosure, as claimed.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

According to one or more embodiments of the present disclosure, this application relates to methods of developing inorganic resists (e.g., metal oxide resists) for EUV patterning. A developing gas is flowed into a process chamber in a cyclic process, with doses of developing gas being followed by purging steps. In various embodiments, the developing gas is provided at a constant pressure or at progressively increasing pressures in each step. The developing gas may be provided at a same temperature or at different temperatures in successive steps, so that the process temperature at the beginning of the cyclic process and during the cyclic process is different from the process temperature at the end of the cyclic process. The purging gas may be a non-reactive gas to purge out the developing gas, a reactive gas to improve selectivity and lithography efficiency, or a combination thereof. Embodiments may increase selectivity of the development etch and increase completeness of the developing etch process regardless of the aspect ratio of the desired openings. Embodiments may allow for additional control of the development process. For example, the selectivity and roughness of the process may be tuned by selecting appropriate chemistry for the purging gas.

Embodiments of the disclosure are described in the context of the accompanying drawings. An embodiment of an example fabrication process including formation and exposure of an EUV-sensitive photoresist film will be described using FIGS. 1A-1C. Embodiments of example developing processes will be described using FIGS. 2A-2C. Embodiments of example fabrication processes for forming conductive features in and over a substrate will be described using FIGS. 3A-3D. An embodiment of a method for processing a substrate will be described using FIG. 4. An embodiment of a method for patterning a photoresist film will be described using FIG. 5. An embodiment of a method for processing a substrate will be described using FIG. 6.

Figure 1A:
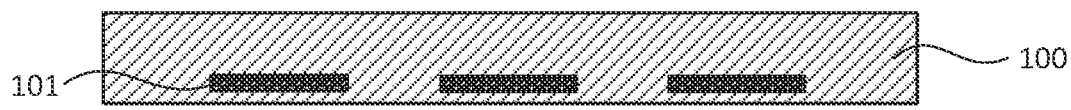
FIGS. 1A-1C illustrate steps of an example fabrication process for forming and exposing a photoresist, in accordance with various embodiments.
Figure 1B:
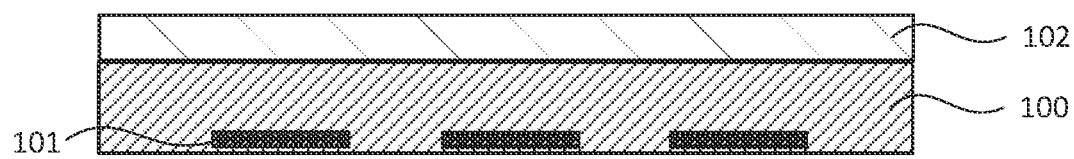
Figure 1C:
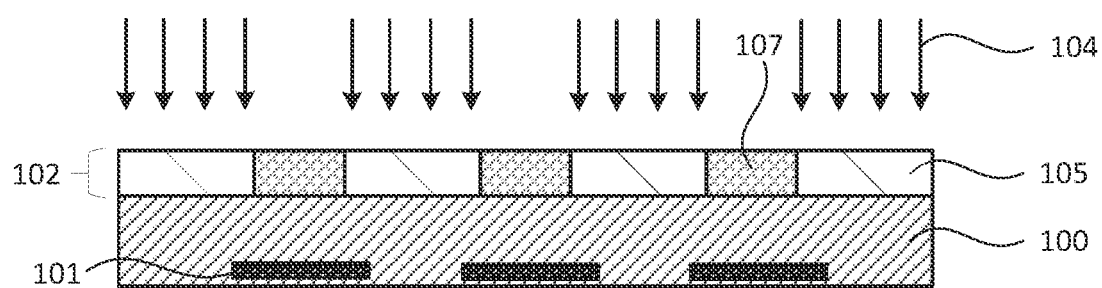

FIGS. 1A-1C illustrate steps of an example fabrication process including formation and exposure of an EUV-sensitive photoresist film. FIG. 1A illustrates a cross-sectional view of an example substrate 100 to be patterned. For example, the substrate 100 may be a silicon wafer having a diameter in a range of 100 mm to 500 mm, such as a diameter of 150 mm, 200 mm, 300 mm, or 450 mm. In various embodiments, the substrate 100 may be a part of, or include, a semiconductor device, and may have undergone a number of steps of processing following, for example, a conventional process. The substrate 100 accordingly may comprise layers of semiconductors useful in various microelectronics. For example, the semiconductor structure may comprise the substrate 100 in which various device regions are formed.

In one or more embodiments, the substrate 100 may be a silicon wafer, or a silicon-on-insulator (SOI) wafer. In certain embodiments, the substrate 100 may comprise silicon germanium, silicon carbide, gallium arsenide, gallium nitride, or other compound semiconductors. In other embodiments, the substrate 100 comprises heterogeneous layers such as silicon germanium on silicon, gallium nitride on silicon, silicon carbon on silicon, as well layers of silicon on a silicon or SOI substrate. In various embodiments, the substrate 100 is patterned or embedded in other components of the semiconductor device. In some embodiments, the substrate 100 comprises conductive features 101 (e.g., metal lines) embedded therein. The conductive features 101 may be electrically coupled to active devices (not illustrated) further embedded in the substrate 100.

FIG. 1B illustrates a cross-sectional view of the substrate 100 after depositing a photoresist film 102 (e.g., a metal oxide resist) over the substrate 100. In various embodiments, although not illustrated, the substrate 100 may further comprise various layers useful for semiconductor device fabrication, which may be collectively regarded as a part of the substrate 100 in this disclosure. For example, in certain embodiments, over the substrate 100, there may be a dielectric layer comprising a silicon-based dielectric material with a low dielectric constant (i.e., low-k value) such as organosilicate glass (SiCOH), dense SiCOH, porous SiCOH, and other porous dielectric materials. Further, there may be a hard mask layer over the substrate 100, which may be patterned in subsequent etch processes after the EUV photopatterning. In various embodiments, the hard mask may comprise titanium nitride, titanium, titanium oxide, tantalum, tungsten carbide, other tungsten based compounds, ruthenium based compounds, or aluminum based compounds. The hard mask may also be carbon-based or silicon-based mask materials.

In one example illustrated in FIG. 1B, the photoresist film 102 is formed over the substrate 100. In addition, the photoresist film 102 may be formed as a part of a tri-layer stack commonly used for photolithographic patterning. The tri-layer stack may be used to generate and transfer a pattern to the hard mask and then, for example, underlying layers such as the dielectric layer of the substrate 100. In various embodiments, the multi-layer stack comprises an underlayer and the photoresist film 102 over the underlayer as an EUV-sensitive photoresist. In one or more embodiments, the underlayer comprises carbon materials (e.g., silicon carbide or silicon oxycarbide) and may be formed via a spin-on process or vapor deposition such as CVD. The multi-layer stack may further comprise layers of oxide (e.g., silicon oxide) or nitride (e.g., titanium nitride or silicon nitride) above the underlayer and the photoresist film 102. For simplicity of illustration, FIG. 1B illustrates only the photoresist film 102 directly deposited on the substrate 100, but as described above, any suitable multi-layer structure may be present as a part of the substrate 100 in various embodiments.

In various embodiments, the photoresist film 102 comprises tin (Sn), antimony (Sb), hafnium (Hf), zirconium (Zr), zinc (Zn), the like, or a combination thereof. In certain embodiments, the photoresist film 102 comprises a metal oxide, a metal alkoxide, or a methacrylate (MAA) of Sn, Sb, Hf, Zr, Zn, or the like, such as ZrMAA, SbMAA, SbMAA:F, HfMAA, ZnMAA, and ZnMAA:F. In certain embodiments, the photoresist film 102 may be a network of metal oxide comprising a metal alkoxide, metal alkenoxide, metal aryloxide, or metal carboxylate group. These groups bonded to the metal are generally represented by chemical formulas, —OR, —OR', —OAr, and —OOCR, respectively, where R is an alkyl group, R' is an alkene group, and Ar is an aryl group. In some embodiments, the photoresist film 102 includes organo-metal bonds in which an organic R group (e.g., a group with a carbon length between 1-10, saturated and unsaturated bonds, one or more aromatic groups, the like, or a combination thereof) is directly bonded to a metal (e.g, tin). In various embodiments, the photoresist film 102 is a polymeric film, and may not have a highly ordered structure such as crystalline. The number of the above functional groups bonded to the metal atom may differ for each metal atom, ranging between 1 and 4. The deposition of the photoresist film 102 may be performed by a dry or wet process. In various embodiments, the photoresist film 102 may be deposited by vapor deposition, for example chemical vapor deposition (CVD), plasma-enhanced CVD (PECVD), atomic layer deposition (ALD), or plasma-enhanced ALD (PEALD).

In certain embodiments, the deposition process for the photoresist film 102 may comprise exposing the substrate 100 to two precursors in a process chamber: a metal-containing precursor (e.g., a tin-containing precursor) and an oxygen-containing precursor. The exposures to these precursors may be performed stepwise or simultaneously. In various embodiments, the deposition process may be an ALD or pseudo-ALD process and comprise two or more exposing steps. For example, the deposition process may be performed by first exposing the substrate 100 to the tin-containing precursor that forms an adsorbed layer on the substrate 100 and, thereafter, exposing the substrate 100 to the oxygen-containing precursor gas that reacts with the adsorbed tin-containing precursor. The exposing steps may be repeated one or more times to increase a thickness of the photoresist film 102 on the substrate 100. In certain embodiments, the exposing steps may be separated temporally or spatially. Temporally separating the exposing steps may be realized by changing the gas composition in a process chamber. On the other hand, spatially separating the exposing steps may be enabled by utilizing multiple spatially segregated sections within the process chamber and transporting the substrate from one section to another. For temporally separating the exposing steps even better, the vapor deposition may further include evacuating, purging, or both evacuating and purging, the process chamber between the exposing steps. These additional steps may be beneficial in ensuring the reaction occurs only on surface and not in the gas phase. The ALD or pseudo-ALD method in accordance with this embodiment may be particularly advantageous in enabling layer-by-layer growth of the photoresist film 102 with a high uniformity.

In another embodiment, instead of the ALD type process, the precursors may be supplied in the process chamber simultaneously to grow the photoresist film 102. Such an embodiment may be advantageous by allowing the continuous growth of the photoresist film 102 in a single step. In this embodiments, the reaction between the precursors may or may not occur in the gas phase as well as on surface.

In other embodiments, the photoresist film 102 may be deposited by liquid deposition using alternate exposures of a tin-containing precursor liquid and an oxygen-containing precursor liquid. The liquid deposition may further include rinsing the substrate with a rinsing solution to remove an excess amount and/or unreacted portion of the precursors between the exposing steps. The rinsing solution may comprise deionized water, common organic solvents such as acetone, propylene glyclol monomethyl ether acteate, 1-Methoxy-2-propanol, methyl isobutyl carbinol, hexane, tert-butanol and isopropanol, or mixtures thereof. In another embodiment, the liquid precursors may be mixed first and the mixture solution may be applied to the substrate to grow the photoresist film 102. In one or more embodiments, one of the precursors may be gaseous and another of the precursors may be liquid, and accordingly two different modes (vapor and liquid) of delivery may be utilized to perform the deposition process.

In various embodiments, after forming the photoresist film 102 over the substrate 100, an optional post-apply bake may be performed to remove any excess solvents from a wet process, residual volatile byproducts from a dry process, or both.

FIG. 1C illustrates a cross-sectional view of the substrate 100 after an exposure to a light pattern, such as an EUV exposure. The method further includes, as schematically illustrated in FIG. 1C, exposing the substrate 100 to an EUV light pattern 104. A photomask may be used to create the EUV light pattern 104 by placing the photomask between the substrate 100 and an EUV light source (not illustrated). In response to the exposure to the EUV light pattern 104, a photoreaction may occur in exposed regions 105 of the photoresist film 102, while unexposed regions 107 remain unchanged. As a result of the photoreaction, the exposed regions 105 may comprise a cross-linked photoresist film, which may have material properties substantially different from the unreacted portion of the photoresist film 102 (i.e., the unexposed regions 107). Such a difference in the material properties includes volatility, reactivity, and/or solubility among others, which gives origin to the tonality as a photoresist.

In various embodiments, after the EUV exposure (see above, FIG. 1C) and prior to a developing step (see below, FIG. 2A), an optional post-exposure bake (PEB) may be performed to further differentiate the material properties between the exposed regions 105 and the unexposed regions 107. In certain embodiments, the PEB may be performed by heating the substrate 100 in a process chamber at a temperature between 70° C. to 250° C., for example between 180° C. to 225° C. in one embodiment, in vacuum or under a gas flow.

Figure 2A:
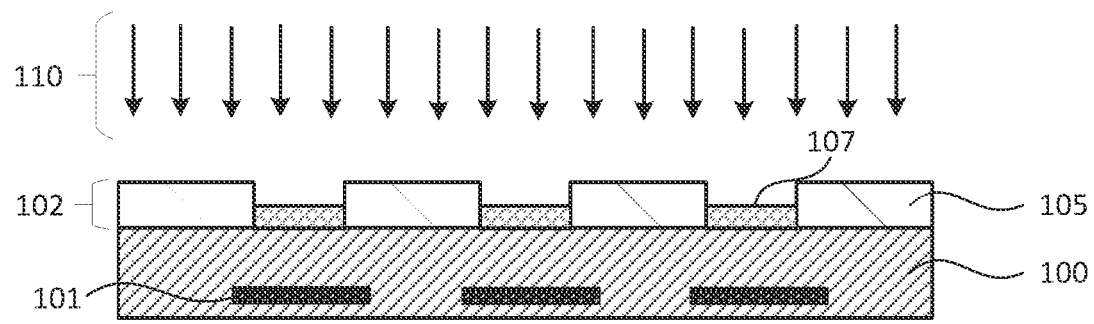
FIG. 2A-2C illustrate steps of an example development process for a photoresist, in accordance with various embodiments.
Figure 2B:
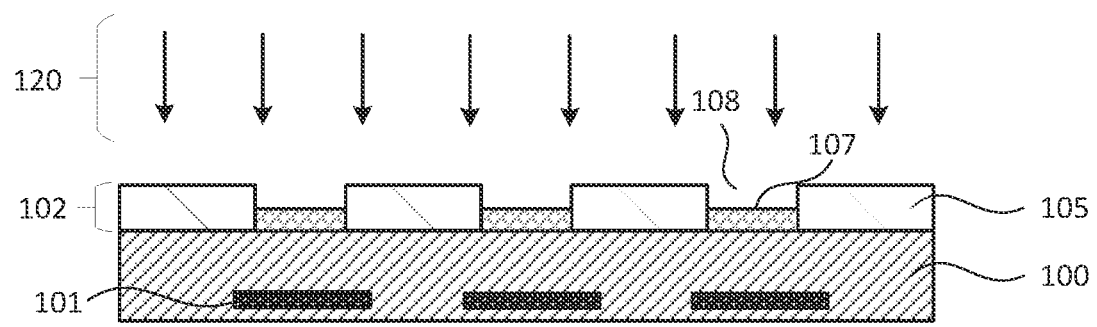
Figure 2C:
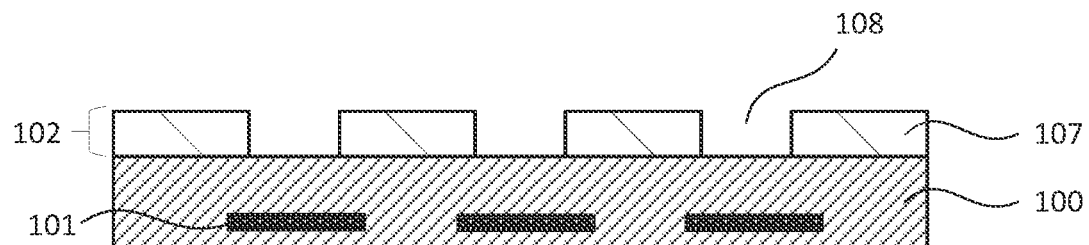

FIGS. 2A-2C illustrate steps of an example cyclic development process (also referred to as a pulsing process or a pulsing mode) of the photoresist film 102 that may be performed after forming and exposing the photoresist film 102, as described above with respect to FIGS. 1A-1C. The cyclic development process is a reactive process at the gas-solid interface, which may allow better process control at the nanoscale than a wet process, e.g., for forming features that are a few nanometers or sub-nanometer in critical dimension. In some embodiments, the cyclic development process (also referred to as a cyclic reactive process) is a plasma-less process, such as a reactive sublimation process. In addition to developing the photoresist film 102, the cyclic reactive process may also be used as a descumming step to remove residues and defects from the photoresist film 102.

The cyclic development process includes multiple developing steps separated by respective purge steps. In each developing step, a developing gas is flowed into a process chamber containing the substrate 100 to partially etch the unexposed regions 107 of the photoresist film 102. Following the developing step and prior to performing another developing step, a purge step is performed. In the purge step, a purging gas is flowed into the process chamber to purge the developing gas. The purging gas may be a non-reacting gas (e.g., an inert gas) or a reacting gas different from the development gas that reacts with the unexposed regions 107. After the purge step, another developing step is performed to further etch the unexposed regions 107 of the photoresist film 102. The developing steps and purge step may be repeated any suitable number of times. Subsequent developing steps may be performed at a same pressure of the developing gas or at different pressures, such as pressures that progressively increase with each additional developing step. Subsequent developing steps may be performed at a same temperature in the process chamber or at different temperatures, so that the process temperature at the beginning of the cyclic development process is different from the process temperature at the end of the cyclic development process.

The cyclic development process is advantageous for increasing completeness of the developing etch process regardless of the aspect ratio of the desired openings and increasing selectivity of the development etch. The cyclic development process may allow for more completeness of the etch (in other words, removing more of the unexposed regions 107) while also maintaining the selectivity of the etch (in other words, removing less of the exposed regions 105). This is advantageous for maintaining the selectivity of the developing etch at high temperatures, such as at about 60° C. Additionally, more material of the unexposed regions 107 may be developed for a given dose of the developing gas over a given dose time. This may enable the development etch to be completed regardless of the aspect ratio of the openings to be formed through the photoresist film 102.

FIG. 2A follows from FIG. 1C and illustrates a cross-sectional view of the substrate 100 during a developing step, in accordance with some embodiments. The substrate 100 is placed in a suitable processing chamber, and a developing gas 110 is flowed into the process chamber. The developing gas 110 reacts with the unexposed regions 107 of the photoresist film 102 to produce volatile byproducts, which then evaporate from the surface of the substrate 100. This recesses the unexposed regions 107 with respect to the exposed regions 105, forming openings 108 in the photoresist film 102. In some embodiments, the developing gas 110 is a reactive gas such as hydrogen bromide (HBr), hydrogen chloride (HCl), boron trichloride ($BCl_3$), organic acids such carboxylic acids, methanol, ethanol, isopropyl alcohol, the like, or a mixture or combination thereof. In some embodiments, different development steps are performed with different developing gases 110. For example, a first developing step may be performed using hydrogen bromide and a second developing step may be performed using boron trichloride.

The developing step may be performed using a flow rate of the developing gas 110 in a range of 25 sccm to 1000 sccm. The developing step may be performed at a temperature in the process chamber in a range of −30° C. to 120° C. The developing step may be performed for a duration of 1 second to 120 seconds.

The developing step may be performed at a pressure in the process chamber in a range of 5 mTorr to 100 Torr. In some embodiments, each developing step is performed at the same pressure, e.g. a pressure of 200 mTorr. In other embodiments, each successive developing step is performed at a progressively increasing pressure. Each successive purging step (between successive developing steps) may also be performed at a progressively increasing pressure. As an example, the pressure is progressively increased from 10 mTorr to 2 Torr every 5 to 10 seconds with doubling pressure at each increment.

In still other embodiments, developing steps are performed at progressively decreasing pressure. As an example, the pressure is progressively decreased from 2 Torr to 10 mTorr every 5 to 10 seconds with doubling pressure at each increment.

In still other embodiments, developing steps are performed at alternating lower and higher pressures. As an example, a developing step is performed at a pressure of 50 mTorr, a second developing step is performed at a pressure of 300 mTorr, a third developing step is performed at a pressure of 50 mTorr, and a fourth developing step is performed at a pressure of 300 mTorr.

Consecutive developing steps may be performed with a preceding developing step at a lower pressure and a following developing step at a higher pressure, with a preceding developing step at a higher pressure and a following developing step at a lower pressure, or with a preceding developing step and a following developing step at a same pressure. Any and all such configurations of relative pressures between developing steps are within the scope of the disclosed embodiments.

FIG. 2B illustrates a cross-sectional view of the substrate 100 during a purging step, in accordance with some embodiments. The purging step follows the developing step described above with respect to FIG. 2A. After the developing step, the developing gas 110 is purged from the process chamber by flowing a purging gas 120. Each developing step may be followed by a purging step. Performing a cyclic development process with successive developing and purging steps may be useful for increasing completeness of the developing etch process regardless of the aspect ratio of the openings 108. The cyclic development process with purging steps between developing steps may also increase selectivity of the development etch by removing more of the unexposed regions 107 while also removing less of the exposed regions 105.

The purging step is performed by flowing a purging gas 120 into the process chamber, which may be a non-reactive (or inert) gas or a reactive gas. In embodiments where the purging gas 120 is a non-reactive gas, the purging gas may be argon (Ar), nitrogen ($N_2$), carbon dioxide ($CO_2$), the like, or a combination thereof. In embodiments where the purging gas 120 is a reactive gas, the purging gas may be boron trichloride ($BCl_3$), water vapor ($H_2O$), chlorine ($Cl_2$), ammonia ($NH_3$), methanol, ethanol, trifluoroethanol, isopropyl alcohol, n-Butanol, tert-Butanol, nonafluoro-tert-butyl alcohol, Ethylene glycol, acetylacetone, hexafluoroacetylacetone, an organic acid (e.g., acetic acid, trifluoroacetic acid, or the like), the like, or a combination thereof. Using a reactive gas for the purging gas 120 may allow for better controlling the selectivity of the etch at nonselective process conditions, such as at temperatures up to 250° C. For example, alternating hydrogen bromide (HBr) as the developing gas 110 in developing steps with a reactive purging gas 120 such as boron trichloride ($BCl_3$) may be useful for improving selectivity and lithography efficiency. The selectivity and roughness of the development process may be tuned by selecting appropriate chemistry (e.g., boron trichloride ($BCl_3$) or water vapor ($H_2O$)) for the purging gas. Following purge steps may be performed at different pressures (e.g., at a progressively increasing pressure, at a progressively decreasing pressure, or at alternatingly increasing and decreasing pressures). Following purge steps may be performed with different gas flows (e.g., at a progressively increasing gas flow rate, at a progressively decreasing gas flow rate, or at alternatingly increasing and decreasing gas flow rates). Following purge steps may be performed for different durations of purge time.

In embodiments where the purging gas 120 is a non-reactive gas, the purging step may be performed using a flow rate of the non-reactive gas in a range of 100 sccm to 2000 sccm. The purging step may be performed at a temperature in the process chamber in a range of −30° C. to 250° C. The purging step may be performed for a duration of 5 seconds to 60 seconds. The purging step may be performed at a pressure in the process chamber in a range of $1\times10^{-3}$ mTorr to $1\times10^3$ mTorr.

In embodiments where the purging gas 120 is a reactive gas, the purging step may be performed using a flow rate of the reactive gas in a range of 10 sccm to 500 sccm. The purging step may be performed at a temperature in the process chamber in a range of −30° C. to 250° C. The purging step may be performed for a duration of 5 seconds to 120 seconds. The purging step may be performed at a pressure in the process chamber in a range of $1\times10^{-1}$ mTorr to $1\times10^3$ mTorr.

In some embodiments, the cyclic development process includes non-reactive purging steps with a non-reactive gas and reactive purging steps with a reactive gas. As an example, a cyclic development process includes a first developing step with hydrogen bromide (HBr), a first purging step with argon (Ar), a second developing step with hydrogen bromide (HBr), and a second purging step with boron trichloride ($BCl_3$). As another example, a cyclic development process includes a first developing step with hydrogen bromide (HBr), a first purging step with boron trichloride ($BCl_3$), a second developing step with hydrogen bromide (HBr), and a second purging step with argon (Ar).

Any and all such arrangements of non-reactive purging steps with reactive purging steps are within the scope of the disclosed embodiments.

In various embodiments, the developing step as described above with respect to FIG. 2A and the purging step as described above with respect to FIG. 2B are repeated for a suitable number of cycles, wherein each cycle contains a developing step followed by a purging step. For example, the developing step and the purging step may be repeated for 1 cycle to 60 cycles. However, any suitable number of developing steps and purging steps in any suitable order may be used. For example, the first developing step may be preceded by a first purging step, and the last purging step may be followed by a last developing step.

FIG. 2C illustrates a cross-sectional view of the substrate 100 after the one or more developing step(s) and one or more purging step(s) of the cyclic development process, in accordance with some embodiments. After the conclusion of the cyclic development process, the exposed regions 105 (see above, FIGS. 1C-2B) have been removed. The openings 108 extend through the remaining unexposed regions 107 of the photoresist film 102. Portions of the top surface of the substrate 100 is exposed through the openings 108. The unexposed regions 107 of the photoresist film 102 may be subsequently used as a mask to etch the substrate 100, e.g. for the formation of conductive features in the substrate 100 (see below, FIGS. 3A-3C). Embodiments of the cyclic development process may increase completeness and selectivity of the developing etch regardless of the aspect ratio of the openings 108, so that the substrate 100 is exposed by the openings 108 while sufficient amounts of the unexposed regions 107 remain for subsequent etching of the substrate 100.

In the embodiments described above referring to FIGS. 1A-2C, the photoresist film 102 is a negative-tone photoresist. In other embodiments, the photoresist film 102 may form a positive-tone photoresist, where the exposed regions 105 may be removed by the developing step and the unexposed regions 107 remain. In one embodiment, the positive-tone photoresist may be enabled by performing an additional chemical treatment such as polymerization to increase an etch resistance of the unexposed regions 107 after the EUV exposure, while the photoreaction in the exposed regions 105 reduces the etch resistance.

Figure 3A:
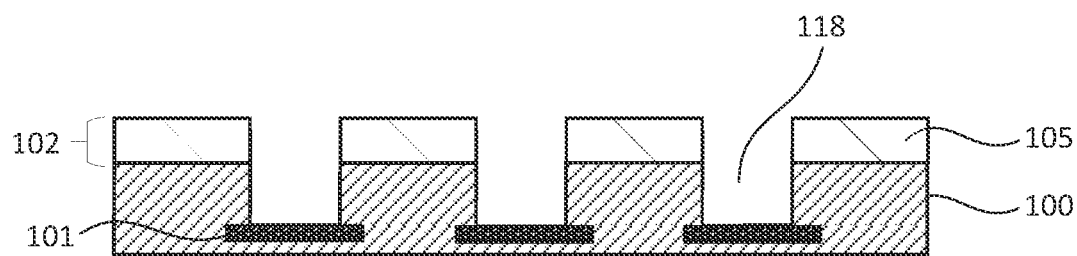
FIGS. 3A-3D illustrate steps of an example fabrication process for forming conductive features in and over a substrate, in accordance with various embodiments.

FIGS. 3A-3D illustrate cross-sectional views of intermediate steps of an example fabrication process for forming conductive features in and over the substrate 100. In FIG. 3A, the openings 108 are extended into the substrate 100 to form openings 118 with a suitable anisotropic etch technique, for example, a reactive ion etch (RIE) process using fluorine chemistry or an atomic layer etching (ALE) process. However, any suitable etching process may be used. The exposed regions 105 of the photoresist film 102 remain over the substrate 100 and act as a mask for the etching process. In some embodiments, the openings 118 expose top surfaces of conductive features 101 (e.g., metal lines) embedded in the substrate 100.

Figure 3B:
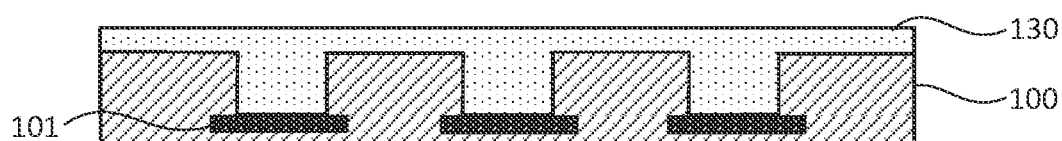

In FIG. 3B, the exposed regions 105 of the photoresist film 102 are removed from over the substrate 100, residues from the etching and planarizing processes are removed, and a conductive material 130 is formed over the substrate 100. The exposed regions 105 of the photoresist film 102 may be removed with a suitable process, such as a planarization process (e.g., a CMP) or the like. In some embodiments, residues from the etching and planarizing process are removed with a suitable cleaning process, such as a rinse with deionized water, hydrogen peroxide, SC-1, the like, or a combination thereof.

Still referring to FIG. 3B, a conductive material 130 is formed over the substrate 100 to fill the openings 118 (see above, FIG. 3A). As an example of forming the conductive material 130, a conformal barrier metal (e.g., TiN or TaN) liner is formed over the exposed surfaces of the substrate 100. Next, the openings 118 are filled with a conductive material 130 such as a metal. For example, the conductive material 130 may be copper formed using electroplating. However, any suitable conductive material and deposition method may be used. In some embodiments, the conductive material 130 makes electrical and physical contact with top surfaces of the conductive features 101.

Figure 3C:
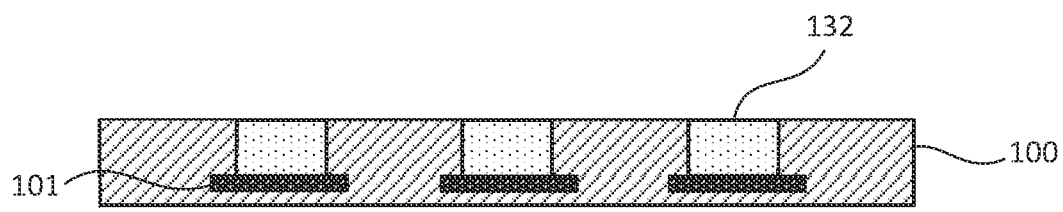

Next, in FIG. 3C, excess conductive material is removed from the top surface of the substrate 100 using a planarization process (e.g., a CMP), thereby forming conductive features 132 inlaid in the substrate 100. In various embodiments, the conductive features 132 are high aspect ratio features. The conductive features 132 may be conductive vias that physically and electrically couple with conductive features 101 of the substrate 100.

Figure 3D:
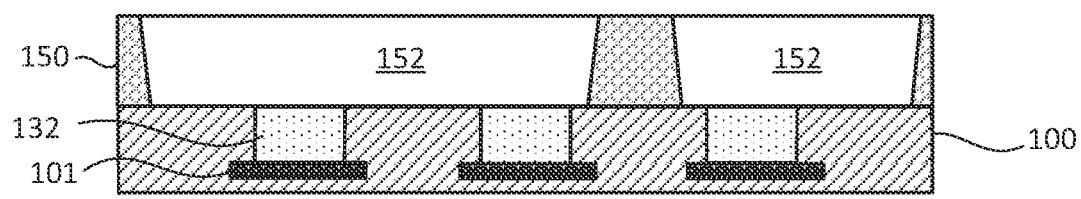

In FIG. 3D, an interconnect layer is formed over the substrate 100 and the conductive features 132. The interconnect layer includes an intermetal dielectric (IMD) 150 with conductive lines 152 formed therein. The IMD 150 comprises an insulating material such as $SiO_2$ or a silicon oxide based low-k dielectric (e.g., porous oxides, fluorosilicate glass (FSG), and orthosilicate glass (OSG)). In some embodiments, the IMD 150 includes a bottom layer that is an etch stop layer (ESL) that comprises a dielectric such as $Si_3N_4$, $SiO_xN_y$, SiC, or SiCN (not shown). The IMD 150 may be formed with a suitable process such as CVD or the like.

Still referring to FIG. 3D, conductive lines 152 may be formed with, for example, a conventional damascene process using a conductive material such as copper or the like. As known by a person skilled in the art, the damascene flow comprises patterning openings (e.g., trenches for conductive lines 152) in the IMD 150, depositing a conformal barrier metal (e.g., TiN or TaN) liner, filling the openings with metal (e.g., using Cu electroplating), and removing all excess conductive material from the top surface of the IMD 150 using a planarization process such as chemical mechanical planarization (CMP), thereby forming the conductive lines 152 inlaid in the IMD 150. In some embodiments, each conductive line 152 is formed to electrically and physically couple with one or more underlying conductive features 132 (e.g., conductive vias).

Figure 4:
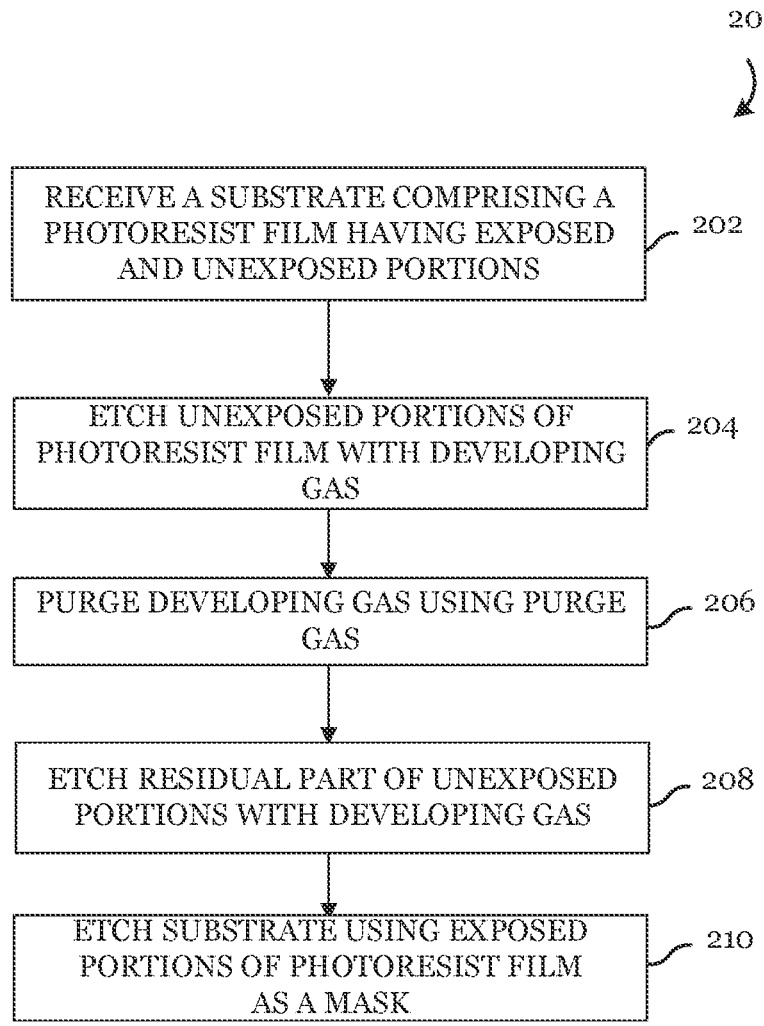
FIG. 4 illustrates a process flow chart diagram of a method for processing a substrate, in accordance with various embodiments.

FIG. 4 illustrates a process flow chart diagram of a method 200 for processing a substrate, in accordance with some embodiments. In step 202, a substrate 100 comprising a photoresist film 102 (e.g., a metal oxide resist) having exposed regions 105 and unexposed regions 107 is received in a process chamber, as described above with respect to FIG. 2A.

In step 204, unexposed regions 107 of the photoresist film 102 are etched with a developing gas 110 in the process chamber leaving a residual part of the unexposed regions 107, as described above with respect to FIG. 2A. In step 206, the developing gas 110 is purged from the process chamber with a purging gas 120, as described above with respect to FIG. 2B. In step 208, the residual part of the unexposed regions 107 are further etched with the developing gas 110, as described above with respect to FIG. 2A.

In step 210, the substrate 100 is etched to form openings 118 using exposed regions 105 of the photoresist film 102 as a mask, as described above with respect to FIG. 3A. Subsequently, conductive features may be formed in the openings 118, as described above with respect to FIGS. 3B-3C.

Figure 5:
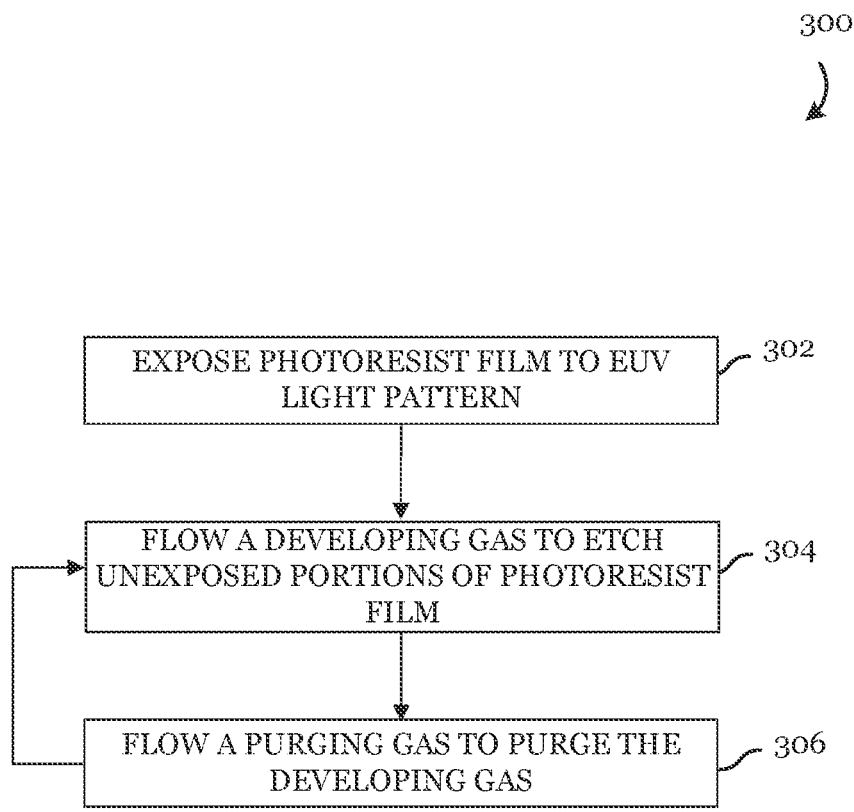
FIG. 5 illustrates a process flow chart diagram of a method for patterning a photoresist film, in accordance with various embodiments.

FIG. 5 illustrates a process flow chart diagram of a method 300 for patterning a photoresist, in accordance with some embodiments. In step 302, a photoresist film 102 over a substrate 100 is exposed to an EUV light pattern 104, as described above with respect to FIG. 1C.

Step 304 and step 306 are one cycle of a cyclic development process that is performed in a process chamber on the photoresist film 102. In step 304, a developing gas 110 is flowed to etch unexposed portions 107 of the photoresist film 102, as described above with respect to FIG. 2A. In step 306, the developing gas 110 is purged from the process chamber by flowing a purging gas 120, as described above with respect to FIG. 2B. In various embodiments, step 304 and step 306 are repeated for a suitable number of cycles, such as 1 cycle to 60 cycles.

Figure 6:
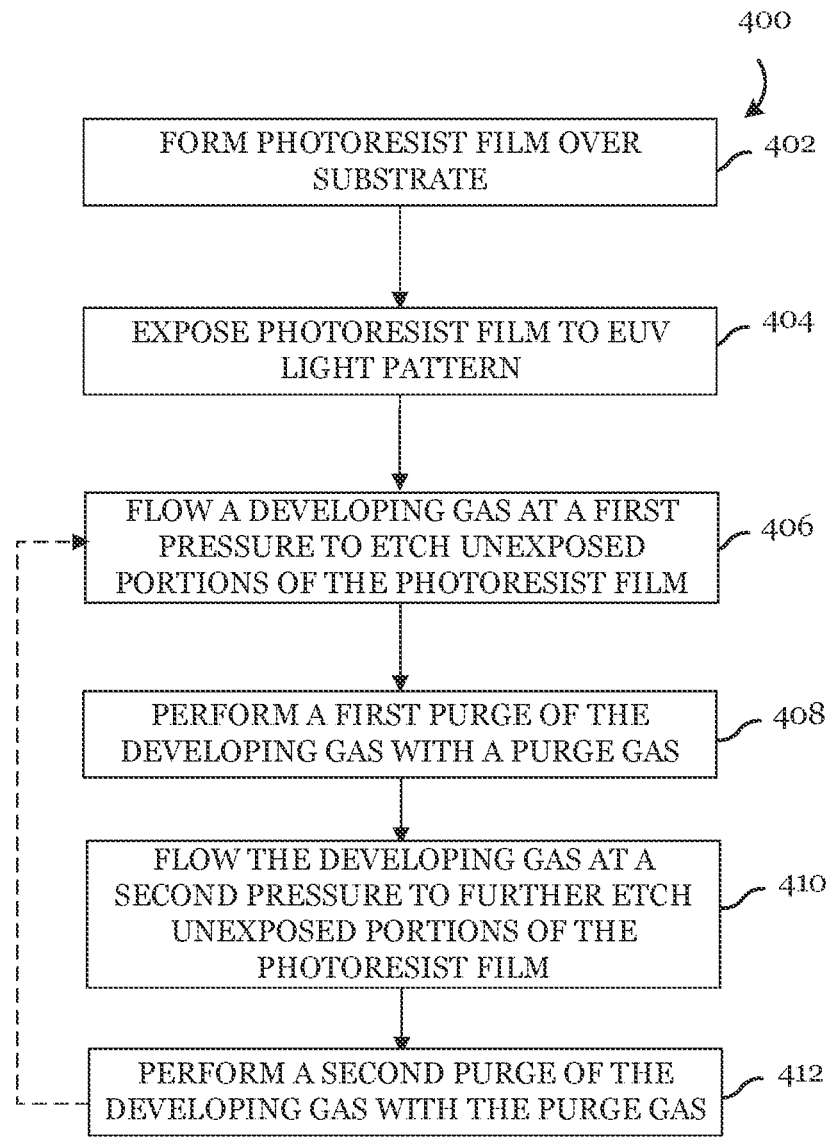
FIG. 6 illustrates a process flow chart diagram of a method for processing a substrate, in accordance with various embodiments.

FIG. 6 illustrates a process flow chart diagram of a method 400 for processing a substrate, in accordance with some embodiments. In step 402, a photoresist film 102 (e.g., a metal oxide resist) is formed over a substrate 100, as described above with respect to FIG. 1B. In step 404, the photoresist film 102 is exposed to an EUV light pattern 104, which forms a pattern of exposed regions 105 and unexposed regions 107 of the photoresist film 102 as described above with respect to FIG. 1C.

In step 406, a developing gas is flowed at a first pressure to etch unexposed regions 107 of the photoresist film 102, as described above with respect to FIG. 2A. In step 408, a first purge is performed to purge the developing gas 110 with a purging gas 120, as described above with respect to FIG. 2B.

In step 410, the developing gas is flowed at a second pressure to further etch unexposed regions 107 of the photoresist film 102, as described above with respect to FIG. 2A. In step 412, a second purge is performed to purge the developing gas 110 with the purging gas 120, as described above with respect to FIG. 2B. In some embodiments, Steps 410 to 412 may be subsequently repeated for an additional number of cycles, such as until the unexposed regions 107 are removed. In some embodiments, the pressure of the developing gas is increased in each additional developing step.

Example embodiments of the disclosure are summarized here. Other embodiments can also be understood from the entirety of the specification as well as the claims filed herein.

Example 1. A method of processing a substrate, the method including: receiving a substrate including a photoresist film including exposed and unexposed portions; etching parts of the unexposed portions of the photoresist film with a developing gas in a process chamber to leave a residual part of the unexposed portions; purging the developing gas from the process chamber with a purging gas; after purging the developing gas, etching the residual part of the unexposed portions with the developing gas; and etching the substrate using exposed portions of the photoresist film as a mask.

Example 2. The method of example 1, where the developing gas includes hydrogen bromide, hydrogen chloride, acetic acid, trifluoroacetic acid, trifluoroethanol, nonafluoro-tert-butyl alcohol, acetylacetone, or hexafluoroacetylacetone.

Example 3. The method of example 1, where the developing gas includes boron trichloride.

Example 4. The method of one of examples 1 to 3, where the purging gas includes argon, nitrogen, boron trichloride, or water vapor.

Example 5. The method of one of examples 1 to 4, where etching parts of the unexposed portions to leave the residual part is performed at a first pressure, etching the residual part of the unexposed portions is performed at a second pressure, and the second pressure is greater than the first pressure.

Example 6. The method of one of examples 1 to 5, where etching parts of the unexposed portions to leave the residual part is performed at a first temperature, etching the residual part of the unexposed portions is performed at a second temperature, and the second temperature is greater than the first temperature.

Example 7. The method of one of examples 1 to 6, where the photoresist film is a metal oxide resist.

Example 8. A method of patterning a photoresist film, the method including exposing a photoresist film to a pattern of extreme ultraviolet light, the photoresist film being over a substrate; and performing a cyclic development process on the photoresist film in a process chamber, where a first cycle of the cyclic development process includes: flowing a developing gas in the process chamber to etch unexposed portions of the photoresist film, and purging the developing gas from the process chamber by flowing a purging gas.

Example 9. The method of example 8, where the developing gas includes hydrogen bromide.

Example 10. The method of one of examples 8 or 9, where the developing gas includes boron trichloride.

Example 11. The method of one of examples 8 to 10, where a second cycle of the cyclic development process includes flowing the developing gas in the process chamber to further etch unexposed portions of the photoresist film, where flowing the developing gas in the second cycle is performed at a greater pressure than flowing the developing gas in the first cycle.

Example 12. The method of one of examples 8 to 10, where a second cycle of the cyclic development process includes flowing the developing gas in the process chamber to further etch unexposed portions of the photoresist film, where flowing the developing gas in the second cycle is performed at a same pressure as flowing the developing gas in the first cycle.

Example 13. The method of one of examples 8 to 12, where the purging gas is an inert gas.

Example 14. The method of one of examples 8 to 12, where the purging gas is boron trichloride or water vapor.

Example 15. A method of processing a substrate, the method including: forming a photoresist film over a substrate; exposing the photoresist film to a pattern of extreme ultraviolet light; flowing a developing gas at a first pressure to etch unexposed portions of the photoresist film; performing a first purge of the developing gas by flowing a purging gas; flowing the developing gas at a second pressure to further etch the unexposed portions of the photoresist film; and performing a second purge of the developing gas by flowing the purging gas.

Example 16. The method of example 15, where the first pressure is the same as the second pressure.

Example 17. The method of example 15, where the second pressure is greater than the first pressure.

Example 18. The method of example 17, further including flowing a developing gas at a third pressure to further etch the unexposed portions of the photoresist film, where the third pressure is greater than the second pressure.

Example 19. The method of one of examples 15 to 18, where the developing gas includes hydrogen bromide and the purging gas includes boron trichloride.

Example 20. The method of one of examples 15 to 18, where the developing gas includes boron trichloride and the purging gas includes water vapor.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed is:

1. A method of processing a substrate, the method comprising:
    receiving a substrate comprising a photoresist film comprising exposed and unexposed portions;
    etching parts of the unexposed portions of the photoresist film with a developing gas in a process chamber to leave a residual part of the unexposed portions;
    purging the developing gas from the process chamber with a first purging gas, the first purging gas being an inert gas;
    after purging the developing gas, etching the residual part of the unexposed portions with the developing gas;
    purging the developing gas from the process chamber with a second purging gas, the second purging gas being a reactive gas; and
    etching the substrate using exposed portions of the photoresist film as a mask.

2. The method of claim 1, wherein the developing gas comprises hydrogen bromide, hydrogen chloride, acetic acid, trifluoroacetic acid, trifluoroethanol, nonafluoro-tert-butyl alcohol, acetylacetone, or hexafluoroacetylacetone.

3. The method of claim 1, wherein the developing gas comprises boron trichloride.

4. The method of claim 1, wherein the first purging gas comprises argon, nitrogen, or carbon dioxide.

5. The method of claim 1, wherein etching parts of the unexposed portions to leave the residual part is performed at a first pressure, etching the residual part of the unexposed portions is performed at a second pressure, and the second pressure is greater than the first pressure.

6. The method of claim 1, wherein etching parts of the unexposed portions to leave the residual part is performed at a first temperature, etching the residual part of the unexposed portions is performed at a second temperature, and the second temperature is greater than the first temperature.

7. The method of claim 1, wherein the photoresist film is a metal oxide resist.

8. The method of claim 1, wherein the second purging gas is boron trichloride.

9. The method of claim 1, wherein the second purging gas is water vapor.

10. A method of patterning a photoresist film, the method comprising:
    exposing a photoresist film to a pattern of extreme ultraviolet light, the photoresist film being over a substrate; and
    performing a cyclic development process on the photoresist film in a process chamber, wherein a first cycle of the cyclic development process comprises:
        flowing a developing gas in the process chamber to etch unexposed portions of the photoresist film, and
        purging the developing gas from the process chamber by flowing a purging gas, wherein the purging gas is boron trichloride or water.

11. The method of claim 10, wherein the developing gas comprises hydrogen bromide.

12. The method of claim 10, wherein the developing gas comprises boron trichloride.

13. The method of claim 10, wherein a second cycle of the cyclic development process comprises flowing the developing gas in the process chamber to further etch unexposed portions of the photoresist film, wherein flowing the developing gas in the second cycle is performed at a greater pressure than flowing the developing gas in the first cycle.

14. The method of claim 10, wherein a second cycle of the cyclic development process comprises flowing the developing gas in the process chamber to further etch unexposed portions of the photoresist film, wherein flowing the developing gas in the second cycle is performed at a same pressure as flowing the developing gas in the first cycle.

15. A method of processing a substrate, the method comprising:
    forming a photoresist film over a substrate;
    exposing the photoresist film to a pattern of extreme ultraviolet light;
    flowing a developing gas at a first pressure to etch unexposed portions of the photoresist film;
    performing a first purge of the developing gas by flowing a purging gas, the purging gas being reactive;
    flowing the developing gas at a second pressure to further etch the unexposed portions of the photoresist film; and
    performing a second purge of the developing gas by flowing the purging gas.

16. The method of claim 15, wherein the first pressure is the same as the second pressure.

17. The method of claim 15, wherein the second pressure is greater than the first pressure.

18. The method of claim 17, further comprising flowing a developing gas at a third pressure to further etch the unexposed portions of the photoresist film, wherein the third pressure is greater than the second pressure.

19. The method of claim 15, wherein the developing gas comprises hydrogen bromide and the purging gas comprises boron trichloride.

20. The method of claim 15, wherein the developing gas comprises boron trichloride and the purging gas comprises water vapor.

* * * * *